(12) United States Patent
Wu et al.

(10) Patent No.: US 7,893,359 B2
(45) Date of Patent: Feb. 22, 2011

(54) EMBEDDED CAPACITOR CORE HAVING A MULTIPLE-LAYER STRUCTURE

(75) Inventors: Shih-Hsien Wu, Taoyuan (TW);
Min-Lin Lee, Hsinchu (TW);
Shinn-Juh Lay, Hsinchu (TW);
Chih-Hao Chang, Hsinchu (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 999 days.

(21) Appl. No.: 11/470,435

(22) Filed: Sep. 6, 2006

(65) Prior Publication Data
US 2007/0062725 A1 Mar. 22, 2007

Related U.S. Application Data

(60) Provisional application No. 60/718,382, filed on Sep. 19, 2005.

(51) Int. Cl.
H05K 1/16 (2006.01)
H05K 1/18 (2006.01)
(52) U.S. Cl. .................. 174/260; 361/794; 361/763
(58) Field of Classification Search .......... 174/260, 174/261; 361/761–764, 792–795
See application file for complete search history.

(56) References Cited

U.S. PATENT DOCUMENTS

| 5,972,053 | A * | 10/1999 | Hoffarth et al. ......... 29/25.03 |
| 6,195,882 | B1 | 3/2001 | Tsukamoto et al. |
| 6,910,266 | B2 | 6/2005 | Lee et al. |
| 6,936,774 | B2 | 8/2005 | Sugaya et al. |
| 2004/0118600 | A1 | 6/2004 | Lee et al. |

FOREIGN PATENT DOCUMENTS

| CN | 1115083 C | 7/2003 |
| CN | 1604720 (A) | 4/2005 |
| DE | 10329657 | 7/2004 |
| JP | 05-7063 | 1/1993 |
| JP | 5055752 | 3/1993 |
| JP | 5062860 | 3/1993 |

(Continued)

OTHER PUBLICATIONS

Chinese Office Action Issued in a Counterpart Application No. 2006101272704.

(Continued)

Primary Examiner—Jeremy C Norris
(74) Attorney, Agent, or Firm—Finnegan, Henderson, Farabow, Garrett & Dunner, LLP

(57) ABSTRACT

An embedded capacitor core including a first set of capacitors, a second set of capacitors, and an inter-layer dielectric film between the first set of capacitors and the second set of capacitors. The first set of capacitors includes: a first conductive pattern comprising at least two conductive electrodes; a second conductive pattern comprising at least two conductive electrodes corresponding to the two conductive electrodes of the first conductive pattern; and a first dielectric film between the first conductive pattern and the second conductive pattern. The second set of capacitors includes: a third conductive pattern comprising at least two conductive electrodes; a fourth conductive pattern comprising at least two conductive electrodes corresponding to the two conductive electrodes of the third conductive pattern; and a second dielectric film between the third conductive pattern and the fourth conductive pattern.

15 Claims, 7 Drawing Sheets

FOREIGN PATENT DOCUMENTS

| | | |
|---|---|---|
| JP | 07-263271 | 10/1995 |
| JP | 8-102427 | 4/1996 |
| JP | 10-84186 | 3/1998 |
| JP | 10084186 | 3/1998 |
| JP | 2000-244129 | 9/2000 |
| JP | 2004-281169 | 10/2004 |
| JP | 2004-296641 | 10/2004 |
| JP | 2005-039234 | 2/2005 |
| JP | 2005-072311 | 3/2005 |
| TW | 511417 | 11/2002 |
| WO | 00/75612 A2 | 12/2000 |

OTHER PUBLICATIONS

Official Communication issued by German Patent Office, prepared on Nov. 30, 2009, in a counterpart application No. 10 2006 042 005.5-34 and English translation thereof.

* cited by examiner

EMBEDDED CAPACITOR CORE HAVING A MULTIPLE-LAYER STRUCTURE

RELATED APPLICATION

This application claims priority from provisional patent application Ser. No. 60/718,382, filed on Sep. 19, 2005, titled "Embedded Capacitor Core Having a Multiple-Layer Structure."

BACKGROUND

The present invention relates to an embedded capacitor core having a multiple-layer structure and a method of manufacturing an embedded capacitor core having a multiple-layer structure and, more particularly, to an embedded capacitor core that can be embedded within a printed circuit board.

Capacitors are electrical devices capable of storing or absorbing electrical charges. With the charge-storing capacity, capacitors have broad applications in the design and operation of electrical circuits, including integrated circuits ("ICs"). As an example, an IC itself may contain a number capacitors coupled with other components for the IC's operations, such as signal processing. In addition to internal capacitors, an IC may also rely on external capacitors to stabilize power supply, to absorb undesirable fluctuations, or to reduce signal interference or noise. For example, an IC mounted on a printed circuit board ("PCB") may be coupled with ceramic capacitors that are also mounted on the PCB for one of those purposes, and the capacitors may be mounted using known surface mount technology ("SMT"). Alternatively, other types of capacitors may be mounted on or in the circuit board and coupled with the IC to provide similar effects as those SMT capacitors.

The coupling between an IC and external capacitors is generally achieved by constructing wiring paths, which may have a significant length compared to the couplings within the IC itself. In certain applications, the length of a winding or narrow path may create inductance from the path itself, leading to undesirable inductance effect affecting IC signals or operations. Additionally, SMT capacitors, although small in size, is also limited in its range of capacitances, the signal frequency it is capable of handling, or both. With the increasing speed of electrical circuits and other components and the shrinking size of devices and available PCB space, finding SMT capacitors that are capable of satisfying the design need becomes a challenge. Additionally, SMT capacitors mounted on a PCB requires certain board space and may limit the board space available for other devices. With the increasing terminals of IC and the densely arranged terminals, the wiring design for coupling the IC to external capacitors may also post another challenge.

Therefore, it may be desirable to provide a capacitor device that can be embedded into other structures, such as a circuit board. It may also be desirable to provide a design having a number of capacitive elements, which may have different resonant frequencies to provide a frequency bandwidth for noise suppression or to be implemented for other applications. It may also be desirable to reduce the wiring paths from an IC to external devices such as capacitors or capacitive-inductive networks.

SUMMARY OF INVENTION

Examples consistent with the invention may provide an embedded capacitor device. The embedded capacitor device may include a first conductive pattern of a first conductive film transferred from a sacrificial substrate; a second conductive pattern of a second conductive film transferred from a second sacrificial substrate; and a first dielectric layer between the first and second conductive films. The first conductive pattern and the second conductive pattern are both infixed into the first dielectric film, and portions of the first dielectric film may be sandwiched between the first conductive pattern and the second conductive pattern.

Another example consistent with the invention provides a method for forming a capacitor device. The method may include: providing a first carrier comprising a first metal substrate; forming a first conductive pattern on a portion of the first metal substrate, wherein the first conductive pattern is thinner than the first metal substrate; providing a second carrier comprising a second metal substrate; forming a second conductive pattern on a portion of the second metal substrate, wherein the second conductive pattern is thinner than the second metal substrate; joining the first carrier and the second carrier with a first dielectric film between at least the first conductive pattern and the second conductive pattern; and removing the first carrier and the second carrier to provide the capacitor device.

An embedded capacitor core according to examples of the invention may include a first set of capacitor devices, a second set of capacitor devices, and an inter-layer dielectric film between the first set of capacitor devices and the second set of capacitor devices. The first set of capacitor devices includes: a first conductive pattern comprising at least two conductive electrodes; and a second conductive pattern comprising at least two conductive electrodes corresponding to the two conductive electrodes of the first conductive pattern. The first conductive pattern and the second conductive pattern are both infixed into the first dielectric film, and portions of the first dielectric film are sandwiched between the first conductive pattern and the second conductive pattern. The second set of capacitor devices includes: a third conductive pattern comprising at least two conductive electrodes; and a fourth conductive pattern comprising at least two conductive electrodes corresponding to the two conductive electrodes of the third conductive pattern. The third conductive pattern and the fourth conductive pattern are both infixed into the second dielectric film, and portions of the second dielectric film are sandwiched between the third conductive pattern and the fourth conductive pattern. In one example, the embedded capacitor core is embedded within a circuit board and at least one of the conductive electrodes of the first or second conductive pattern is electrically coupled to at least one of the conductive electrodes of the third or fourth conductive pattern.

An example consistent with the invention provides a method for forming an embedded capacitor core. The method include: forming a first conductive pattern comprising at least two conductive electrodes on a first carrier; forming a second conductive pattern comprising at least two conductive electrodes on a second carrier, wherein the two conductive electrodes of the second conductive pattern correspond to the two conductive electrodes of the first conductive pattern; joining the first carrier and the second carrier with a first dielectric film between at least the first conductive pattern and the second conductive pattern; removing the first carrier and the second carrier; forming a third conductive pattern comprising at least two conductive electrodes on a third carrier; forming a fourth conductive pattern comprising at least two conductive electrodes on a fourth carrier, wherein the two conductive electrodes of the fourth conductive pattern correspond to the two conductive electrodes of the third conductive pattern; joining the third carrier and the fourth carrier with a second dielectric film between at least the third conductive pattern and the fourth conductive pattern; removing the third carrier and the fourth carrier; and joining the first, second, third, and fourth conductive patterns, the second conductive pattern and the third conductive pattern having an inter-layer dielectric film therebetween. In one example, the embedded capacitor core is embedded within a circuit board and at least one of the conductive electrodes of the first or second conductive pattern is electrically coupled to at least one of the conductive electrodes of the third or fourth conductive pattern.

Examples consistent with the invention may allow conductors be infixed into a dielectric layer and may provide a thin capacitor core. Examples consistent with the invention may also allow the capacitor core be placed close or adjacent to a power wiring layer and a ground wiring layer of circuit board. Another example consistent with the invention provides a printed circuit board having at least one embedded capacitor core. The embedded capacitor core includes a first set of capacitors, a second set of capacitors, and an inter-layer dielectric film between the first set of capacitors and the second set of capacitors. The first set of capacitors includes: a first conductive pattern comprising at least two conductive electrodes; a second conductive pattern comprising at least two conductive electrodes corresponding to the two conductive electrodes of the first conductive pattern; and a first dielectric film between the first conductive pattern and the second conductive pattern. The second set of capacitors includes: a third conductive pattern comprising at least two conductive electrodes; a fourth conductive pattern comprising at least two conductive electrodes corresponding to the two conductive electrodes of the third conductive pattern; and a second dielectric film between the third conductive pattern and the fourth conductive pattern. In one example, the embedded capacitor core is embedded within a circuit board and at least one of the conductive electrodes of the first or second conductive pattern is electrically coupled to at least one of the conductive electrodes of the third or fourth conductive pattern.

A further example consistent with the invention includes a printed circuit board that includes at least one embedded capacitor core. Each embedded capacitor core includes a plurality of layers of conductive patterns each having a plurality of conductive electrodes and being infixed into one or more dielectric layers. In particular, the plurality of layers of conductive patterns may be stacked together to provide one or more capacitors.

BRIEF DESCRIPTION OF THE SEVERAL VIEWS OF THE DRAWINGS

The following description of the embodiments of the invention may be better understood when read in conjunction with the appended drawings. The drawings are for the purpose of illustrating certain embodiments of the invention. It should be understood, however, that the invention is not limited to the precise arrangements and instrumentalities shown. In the drawings.

DETAILED DESCRIPTION OF THE INVENTION

Examples of the present invention include an embedded capacitor core, which may include a multiple-layer capacitor structure formed from conductive patterns. The embedded core can be embedded within a PCB to serve as an Embedded Decoupling Capacitor ("EDC"). Examples of the present invention also include methods for forming an embedded capacitor core. In some examples, one or more embedded capacitor cores, each containing one or more capacitors, may serve as an EDC of an IC, which in some applications may reduce power/ground bounce or signal noise of the IC. Examples of the present invention also include incorporating one or more embedded capacitor cores in a PCB, such as placing one or more embedded capacitor cores in certain locations of a PCB having multiple layers of wiring networks.

Additionally, examples consistent with the invention may provide a capacitor device having a high-dielectric-constant dielectric layer with conductors buried in from opposite sides of the dielectric layer, thereby providing a capacitor device with a short distance between the conductors and a high capacitance. In some examples, the capacitor device may be embedded in a substrate or printed circuit board as a capacitor core for various applications. Some examples consistent with the invention may also provide a number of capacitors having different resonant frequencies to provide a wide range of frequency bandwidth, which may be employed for noise suppression or other applications. Some examples also provide a capacitor, which may have conductors buried in from opposite sides of a high-dielectric-constant dielectric layer, embedded in a circuit substrate or a printed circuit board to reduce the wiring paths from one or more ICs to external devices such as capacitors or capacitive-inductive networks.

In the design of ICs, currents flowing through power, ground, and other signal terminals. Unfortunately, false signaling may occur due to power/ground bounce and voltage/current switching noises. Appropriate external circuitry, such as a decoupling capacitor circuitry, may distribute or decouple undesirable bounces in power terminals or signal noises to minimize its unintended effect on circuit operation. The reduction or removal of undesirable power-terminal bounces or signal noise also may reduce the electro magnetic interference ("EMI") caused by the IC or the system, which may have effects on other surrounding circuitry or systems.

Figure 1:
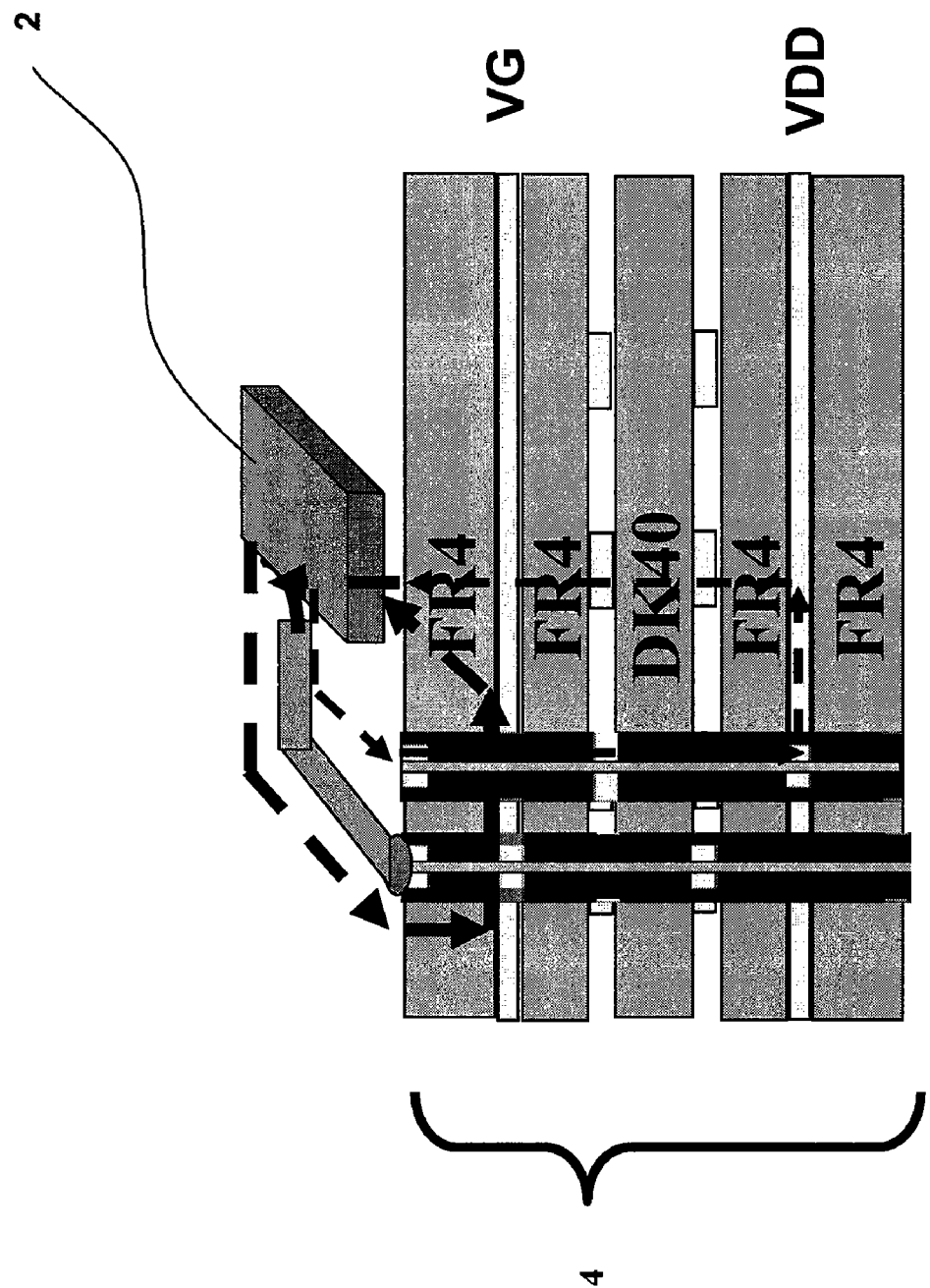
FIG. 1 illustrates a cross-sectional view of an exemplary configuration for coupling an IC to an external decoupling capacitor.

FIG. 1 illustrates an example of an external decoupling capacitor configuration for IC 2, which may be mounted on PCB 4. Referring to FIG. 1, one or more sets of power or signal terminals of IC 2 may be coupled to one or more external capacitive loops. For example, a power terminal VDD of IC 2 may be wired to one capacitor electrode connected to a lower wiring layer of PCB 4, and a ground terminal VG of IC 2 maybe wired to another capacitor electrode connected to an upper wiring layer of PCB 4. However, for certain applications, the illustrated configuration may have too much inductance resulting from long wiring paths to capacitors, and inductance effect may impact the external capacitors' effects in reducing undesirable ground or power bounce in some examples.

Table 1 below illustrates the specifications of an exemplary PCB.

TABLE 1

Exemplary PCB Electrical Specifications

| Parameter | Min | Max | Units |
|---|---|---|---|
| Trace velocity: S0 (outer layers) | 1.6 | 2.2 | ns/ft |
| Trace velocity: S0 (inner layers) | 2.0 | 2.2 | ns/ft |
| Trace impedance: Z0 (all layers) | 54 | 66 | ohms |

Figure 2:
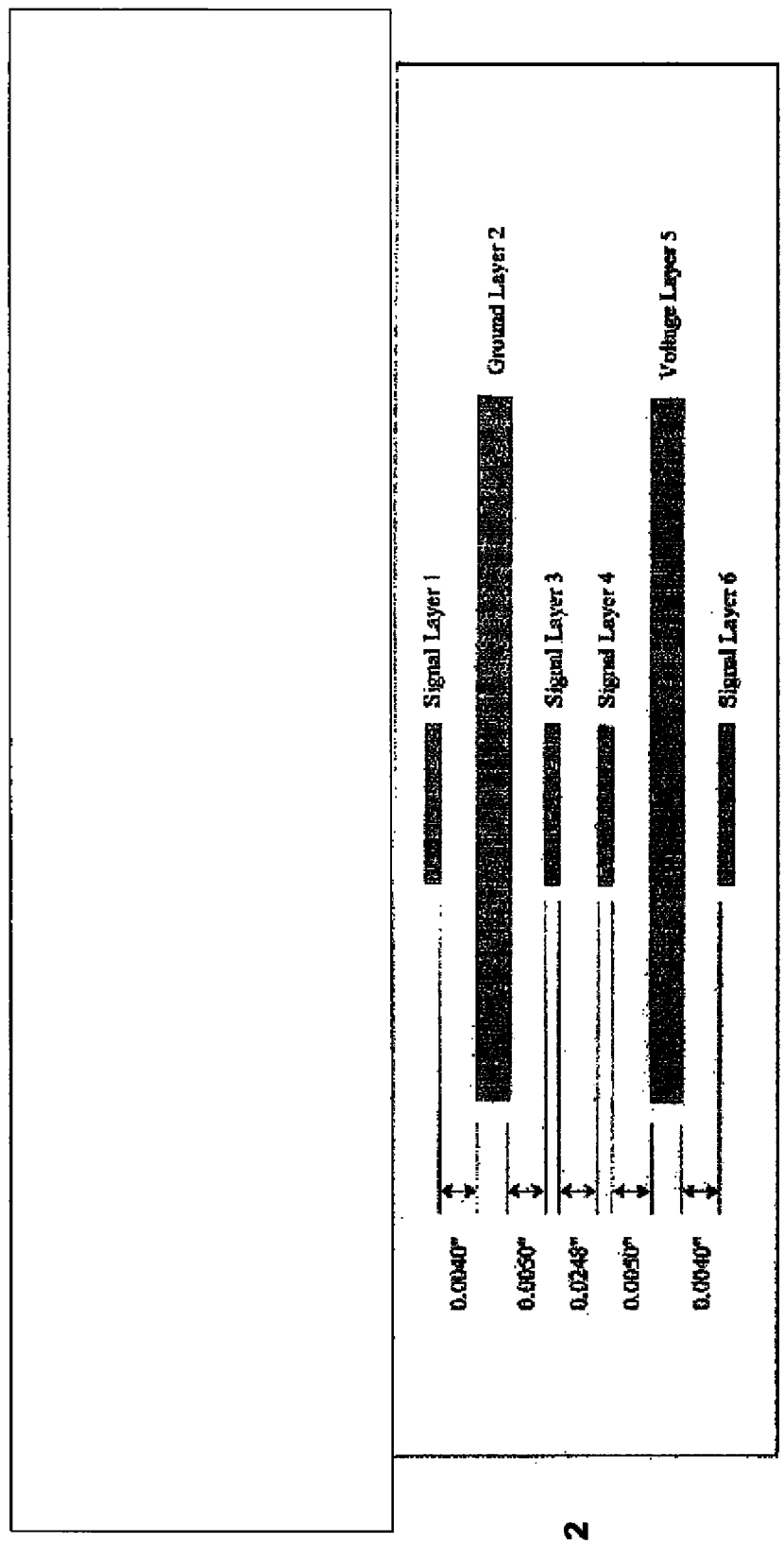
FIG. 2 illustrates a cross-sectional view of an exemplary structure of forming conductive layers within a PCB.

As illustrated, the impedance of wiring paths going through the PCB may be in the range of about 54 to 60 ohms. However, to achieve appropriate impedance control, the PCB wiring paths or layers should be designed adequately to maintain adequate impedance level. Traditional design of multi-layered wiring to control impedance may be adequate for general circuitry signals, but not power currents. FIG. 2 illustrates an exemplary structure of forming conductive layers within a PCB. Referring to FIG. 2, a ground layer may be incorporated in an upper portion of the PCB for coupling the ground terminals, and a voltage layer may be incorporated in a lower portion of the PCB for coupling one of the power terminals.

Figure 3:
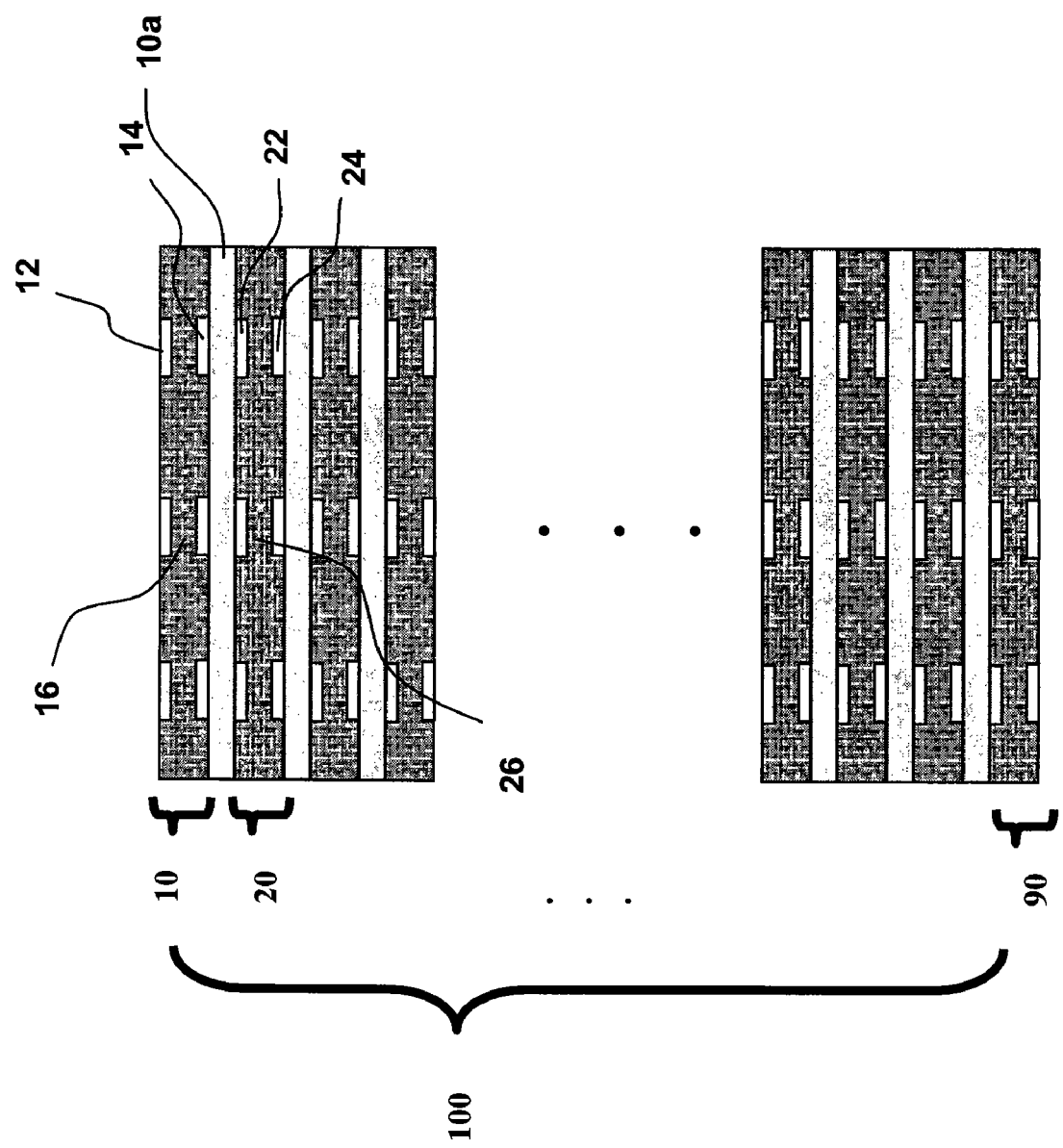
FIG. 3 illustrates a cross-sectional view of an example of an embedded capacitor core.

FIG. 3 illustrates an example of embedded capacitor core 100. As illustrated in this example, embedded capacitor core 100 may include multiple sub-structures, each of which may contain a set of capacitors. For example, embedded capacitor core 100 may include first set of capacitors 10, second set of capacitors 20, all the way through Nth set of capacitors 90, each of which contains a set of capacitors in this example. Referring to FIG. 3, first set of capacitors 10 may include first conductive pattern 12, which has two or more conductive electrodes, and second conductive pattern 14, which also has two or more conductive electrodes that may correspond to the two conductive electrodes of first conductive pattern 12. Between the two conductive patterns 12 and 14, there is a first dielectric film 16, which may contain an organic material. The term "correspond to", in some examples, can encompass a functional correspondence, such as the interaction between two electrodes, or a physical correspondence, such as the physical location or size of two electrodes. Similar to first set of capacitors 10, second set of capacitors 20 may include a third conductive pattern 22, which has two or more conductive electrodes, and a fourth conductive pattern 24, which also has two or more conductive electrodes that may correspond to the two conductive electrodes of third conductive pattern 22. Similarly, between the two conductive patterns 22 and 24, there is a second dielectric film, which may contain an organic material.

Figure 4:
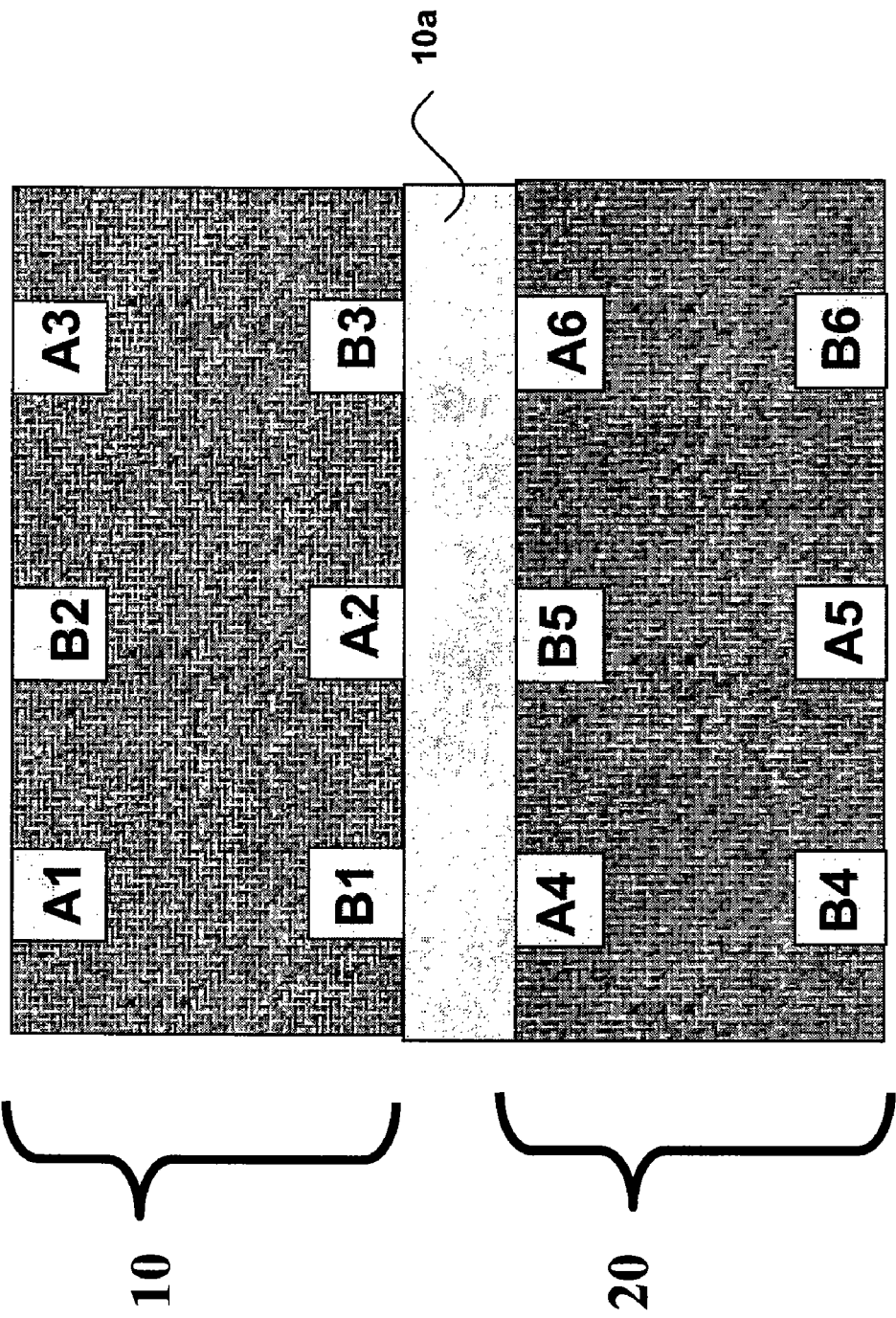
FIG. 4 illustrates a cross-sectional view of separate electrodes of two separate cores.

To stack two or more set of capacitors illustrated above, inter-layer dielectric film 10a can be provided between first set of capacitors 10 and second set of capacitors 20. As noted above, embedded capacitor core 100 may be embedded within a PCB. Additionally, it is noted that the conductive patterns illustrated in FIG. 4 are merely an illustrative example, and each layer of the conductive patterns and dielectric film may vary in its shape, size, and thickness for various design considerations, such as capacitance, operational frequency, IC terminal locations, etc. In one example, at least one of the conductive electrodes of the first or second conductive pattern 10 can be electrically coupled to at least one of the conductive electrodes of the third or fourth conductive pattern to form a third set of capacitor or capacitors. In some examples, each of the first, second, third, and fourth can have a thickness between about 5 μm to about 30 μm; each of the dielectric film can have a thickness between about 10 μm to about 50 μm; and the inter-layer dielectric file can have a thickness between about 5 μm to about 50 μm. Accordingly, even with a stacked structure of two or more capacitor sets like sets 10 and 20, a very thin embedded capacitor core may still be provided in some examples.

To provide the electrodes, the first, second, third, and fourth conductive patterns 12, 14, 22, and 24 contain conductive materials, such as metal, and copper may be used in one example. Different dielectric materials may be used as the dielectric films 16 and 26. In one example, at least one of the first and second dielectric films 16 and 26 may be an organic material and have a dielectric constant of a value between 10 and 500. In one example, the dielectric constant is no less than 10. The use of organic materials may facilitate the formation of embedded capacitor core and provide adequate dielectric characteristics. In one example, at least one of the first and second dielectric films may contain an epoxy material containing $BaTO_3$. In some examples, a bonding layer may serve as or be included as a part of inter-layer dielectric film 10a in FIG. 3 to join first set of capacitors 10 with second set of capacitors 20. Additionally, the bonding layer may have a high dielectric constant, such as a dielectric constant of a value between 3 and 500, to serve as a dielectric film and provide an adequate level of capacitance in combination with adjacent electrodes. In one example, an organic bonding material may be used and it may have a dielectric constant of no less than 3.

The formation of capacitors among the electrodes of the first, second, third, and fourth conductive patterns have numerous possibilities. Depending on the electrode couplings and the configuration, embedded capacitor core 100 illustrated in FIG. 3 may provide a single capacitor jointly formed by all the electrodes or a number of separate capacitors separately formed from electrode pairs. FIG. 4 illustrates an example illustrating how separate electrodes of set 10 and set 20 may be coupled. In some examples, the electrodes may be "crossly" coupled to provide one or more capacitors. For example, set 10 and set 20 may provide multiple capacitors jointly as one single capacitor or two or more capacitors. In one example, electrodes A 1 through A 6 can be jointly coupled to as one terminal, and electrodes B 1 through B 6 can be jointly coupled to as another terminal, there by forming capacitors at least between each of the A 1 -B 1, A 2 -B 2, A 3 -B 3, A 4 -B 4, A 5 -B 5, A 6 -B 6, A 1 -B 2, B 2 -A 3, B 1 -A 2, A 2 -B 3, B 1 -A 4, A 2 -B 5, B 3 -A 6, A 4 -B5, B 5 -A 6, B 4 -A 5, and A 5 -B 6 electrode pairs.

In another example, electrodes A 1 through A 3 can be jointly coupled to a first terminal, and electrodes B1 through B 3 can be jointly coupled to a second terminal, there by forming capacitors at least between each of the A 1 -B 1, A 2 -B 2, A 3 -B 3, A 1 -B 2, B 2 -A3, B 1 -A 2, and A2 -B3 electrode pairs. Accordingly, set 10 may provide a single capacitor coupled between a pair of terminals. Additionally, electrodes A4 through A6 can be jointly coupled to a third terminal of the IC, and electrodes B 1 through B 3 can be jointly coupled to a fourth terminal of the IC, there by forming capacitors at least between each of the A 4-B 4, A 5 -B 5, A 6 -B 6, A 2 -B 5, B 3-A 6, A4 -B 5, B 5 -A6, B 4 -A 5, and A 5-B 6 electrode pairs. Accordingly, set 20 may provide a single capacitor coupled between another pair of IC terminals. The embedded capacitor core therefore may provide two separate capacitors under this configuration.

Therefore, the conductive patterns and the coupling of the electrodes in those conductive patterns can be designed in numerous ways to suit different design needs, either as embedded decoupling capacitors or other capacitive devices.

The above examples are merely illustrative, and the various design changes that may be made by persons skilled in the art for different applications based the teaching of this application.

Figure 5:
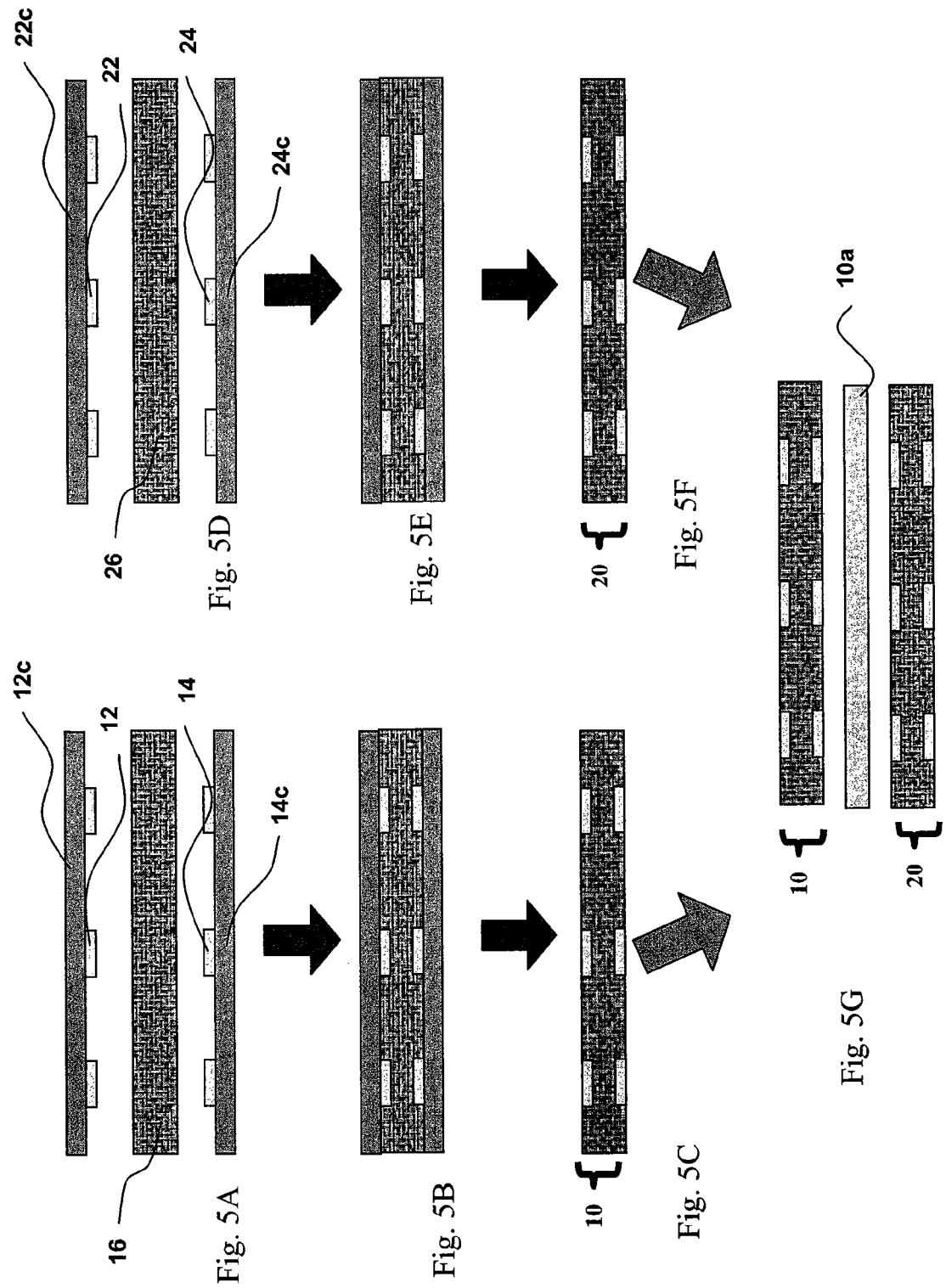
FIGS. 5A-5G illustrate cross-sectional views of an example of forming an embedded capacitor core.

FIGS. 5A-5G illustrate an example of forming an embedded capacitor core. Referring to FIG. 5A, the method for forming embedded capacitor set 10 may include forming first conductive pattern 12 comprising at least two conductive electrodes on first carrier 12c and forming second conductive pattern 14 comprising at least two conductive electrodes on second carrier 14c. In one example, the two conductive electrodes of second conductive pattern 14 may correspond to the two conductive electrodes of first conductive pattern 12. Referring to FIG. 5B, the method then includes joining first carrier 12c and second carrier 14c with first dielectric film 16 between at least first conductive pattern 12 and second conductive pattern 14. Referring to FIG. 5C, first carrier 12c and the second carrier 14c may then be removed, thereby providing first capacitor core set 10.

In other words, by using a process illustrated above, a capacitor device having one or more capacitors with a thin structure and higher capacitance may be provided. In one example, such a capacitor device may include a first conductive pattern of a first conductive thin film transferred from a sacrificial substrate, and the first conductive thin film may have a thickness of a few micrometers to a few hundred micrometers, depending on the applications, the capacitor design, and the manufacturing processes. The capacitor device may also include a second conductive pattern of a second conductive thin film transferred from a second sacrificial substrate, and the second conductive thin film may have a thickness of a few micrometers to a few hundred micrometers, depending on the applications, the capacitor design, and the manufacturing processes. In some examples, a conductive film of no less than 5 micrometers, such as one that is 5, 30, or 50 micrometers thick, can be used as the first conductive film, the second conductive film, or both. And the first conductive pattern and the second conductive pattern may both be infixed into the first dielectric film, and portions of the first dielectric film may be sandwiched between the first conductive pattern and the second conductive pattern.

In some examples, the first sacrificial substrate, the second sacrificial substrate, or both may include a metal substrate provided for forming the first conductive pattern, the second conductive pattern, or both thereon and infixing the first and second conductive patterns into the first dielectric film, such as by the process illustrated above. The first and second conductive patterns or one of them may be infixed into the first dielectric film by a conductive pattern infix process or other conductive pattern transfer processes. The first and second conductive patterns or one of them may include copper, such as electrically-plated or coated cooper film. In some examples, the first dielectric film may include an organic dielectric film, such as an organic dielectric film having a dielectric constant of no less than 10.

Similar process may be used to provide second capacitor set 20 in FIG. 5F. Referring to FIG. 5D, the method for forming embedded capacitor set 20 may include forming third conductive pattern 22 comprising at least two conductive electrodes on third carrier 22c and forming fourth conductive pattern 24 comprising at least two conductive electrodes on fourth carrier 24c. In one example, the two conductive electrodes of fourth conductive pattern 24 may correspond to the two conductive electrodes of third conductive pattern 22. Referring to FIG. 5E, the method then includes joining third carrier 22c and fourth carrier 24c with second dielectric film 26 between at least third conductive pattern 22 and fourth conductive pattern 24. Referring to FIG. 5F, third carrier 22c and the fourth carrier 24c may then be removed.

Referring to FIG. 5G, first capacitor set 10 can then be stacked over second capacitor set 20 with inter-layer dielectric film 10a between them. In other words, first, second, third, and fourth conductive patterns 12, 14, 22, and 24 are joined together with an inter-layer dielectric film between the second conductive pattern and the third conductive pattern in the illustrated example. As noted above, an embedded capacitor core, which may have two or more capacitor sets like capacitor set 10 and 20, may be embedded within a circuit board. Additionally, at least one of the conductive electrodes of the first or second conductive pattern 12 or 14 may be electrically coupled to at least one of the conductive electrodes of the third or fourth conductive pattern 22 or 24.

As noted above, in some examples, the embedded capacitor core may be incorporated within a printed circuit board to provide an embedded decoupling capacitor. To provide the electrodes, the first, second, third, and fourth conductive patterns 12, 14, 22, and 24 contain conductive materials, such as metal, including copper. In some examples, an infix copper pattern or copper-containing pattern may be formed in a dielectric layer of a high dielectric constant through a sacrificial carrier. The carrier may serve as a substrate for supporting the conductive pattern during the formation process of a capacitor set and may be removed later. Accordingly, the carrier can be made of a material that can be removed later while preserving the conductive pattern or most of it. In some examples, a carrier and a conductive pattern can be made of different copper, or copper with different quality or characteristics. For example, a thicker metal or copper layer may serve as a carrier to facilitate transportation of the material. And an electrically-plated or coated copper film may serve as a thin conductive pattern film, which may have its pattern defined by known processes, such as a combination of lithography and etch processes. In some examples, the conductive pattern film(s) for a capacitor device may have a wide range for its thickness. For example, a conductive pattern film may have a thickness of 5, 10, several dozen, or even a few or several hundred micrometers. In one example, a conductive pattern film is no less than 5 micrometers. Examples consistent with the invention may provide a high capacitance with a thin structure having infixed conductors. After the electrode pattern is defined, the carrier copper may be removed by an etching or other processes.

As noted above for the embedded capacitor core, different dielectric materials, including organic ones, may be used as the dielectric films 16 and 26. In one example, at least one of the first and second dielectric films 16 and 26 may have a dielectric constant of no less than 10. The use of organic materials may facilitate the formation of embedded capacitor device and provide adequate dielectric characteristics. For example, referring to FIGS. 5B and 5E, during the process of joining two carriers or two sets of conductive patterns, an organic dielectric material can somewhat flow or become flexible enough to cover the conductive patterns without creating too many air gaps and without requiring a very high processing temperature. For example, a high temperature process as high as 800° C., which may be used for the process of making traditional ceramic capacitors, can be avoided and a low temperature process of about 200° C., or in the range of about 150° C. to 400° C., can be used. In one example, at least one of the first and second dielectric films may contain an epoxy material containing $BaTO_3$. In some examples, a bonding layer may serve as or be included as a part of the inter-layer dielectric film 10a in FIG. 5G to join first set of capacitors 10 with second set of capacitors 20. As noted above, the bonding layer may have a high dielectric constant, such as a dielectric constant of no less than 3, to serve as a dielectric film and provide an adequate level of capacitance in combination with adjacent electrodes. In one example, an organic bonding material may be used.

Figure 6:
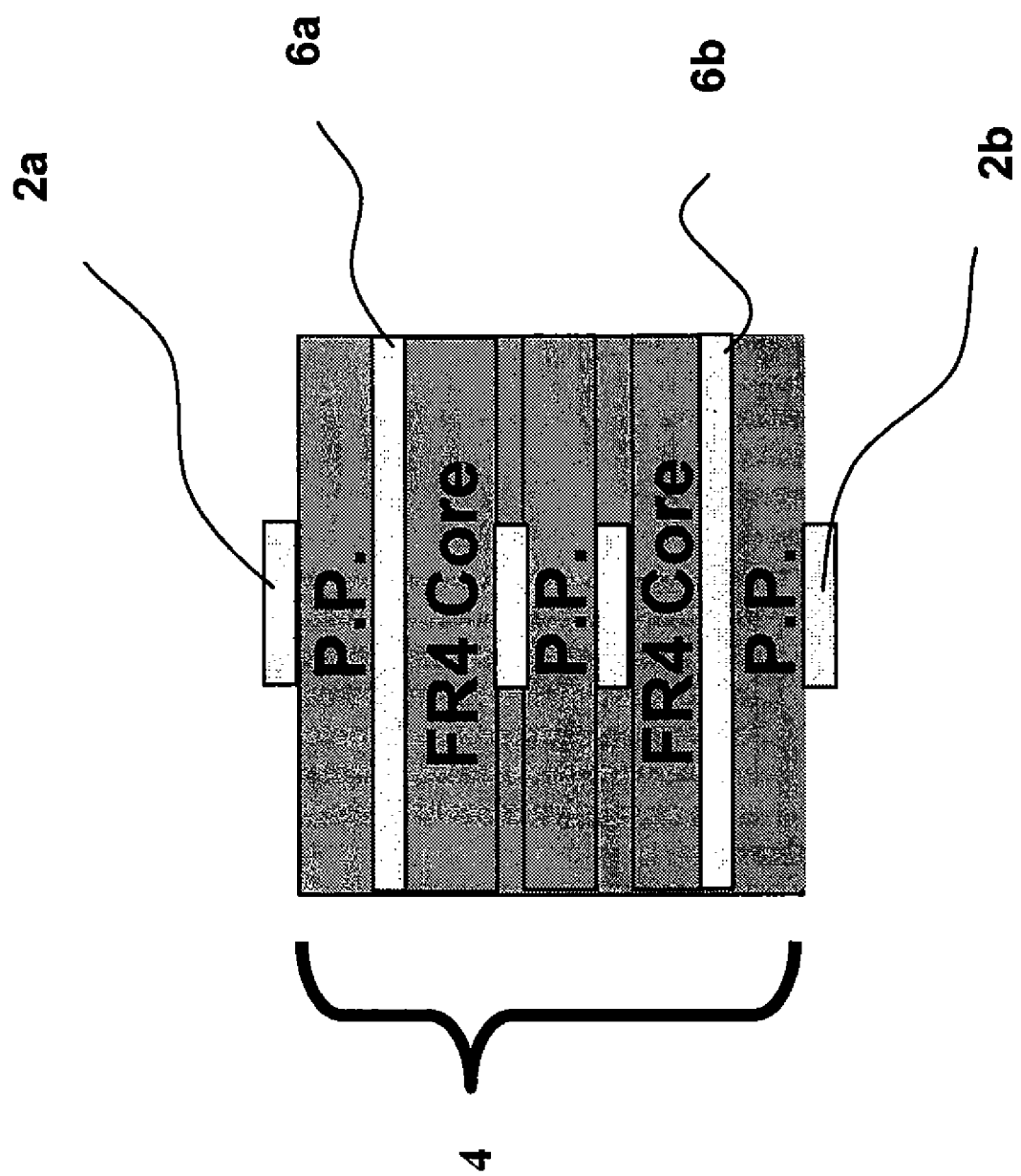
FIG. 6 illustrates a cross-sectional view of an example of providing capacitor coupling to ICs.

FIG. 6 illustrates an example of providing capacitor coupling to ICs 2a and 2b within PCB 4. The illustrated design has four wiring layers stacked between the prepreg (P.P.), FR4 Core, P.P., FR4 Core, and P.P. layers. Among the wiring layers, the top layer 6a is coupled to a power terminal of ICs 2a and 2b, and the bottom layer 6b is coupled to a ground terminal of ICs 2a and 2b. Using these wiring layers, the power and ground terminals can be coupled to one or more capacitors. However, such configuration creates unequal lengths for the power-to-capacitor and the ground-to-capacitor wiring paths. For example, for IC 2a, the power-to-capacitor wiring path is shorter than the ground-to-capacitor wiring path. The design may cause some undesirable ground bounce for IC 2a in some cases. In contrast, for IC 2b, the power-to-capacitor wiring path is longer than the ground-to-capacitor wiring path. The design may cause some undesirable power bounce for IC 2b in some cases. Additionally, the significantly longer ground-to-capacitor wiring path for IC 2a, the significantly longer power-to-capacitor wiring path for IC 2b, both going through a significant vertical path, such as a through via, also may create undesirable inductance, which may lead to some power or ground bounce in some examples.

Figure 7:
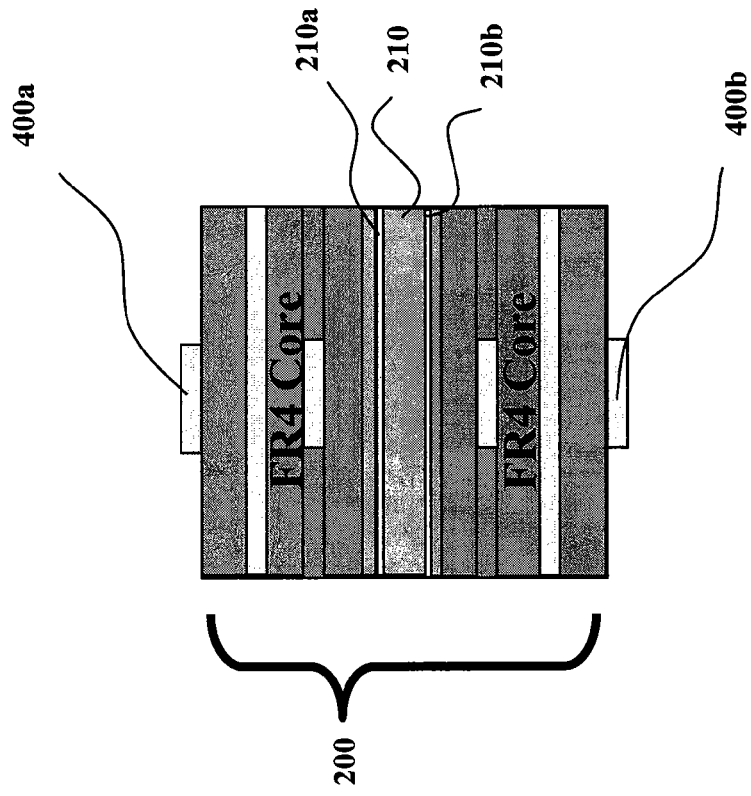
FIG. 7 illustrates a cross-sectional view of an example of providing embedded capacitor core couplings to ICs.

To avoid the issues noted above in some examples, one or more embedded capacitor core can be embedded within a PCB with a symmetric configuration. The multiple-layer design of an embedded capacitor core may provide desirable capacitive effect without requiring significant space or PCB thickness in some examples. FIG. 7 illustrates an example of providing embedded capacitor core couplings to ICs 400a and 400b within PCB 200. In this example, embedded capacitor core 210 is embedded near or at the center layer of PCB 200. Power and ground wiring layers 210a and 210b may be placed close or adjacent to and separately coupled to the terminals of embedded capacitor core 210.

In addition to those two wiring layers, PCB 200 may contain additional wiring layers, such as the other two to four wiring layers shown in FIG. 7, between ICs 400a and 400b. Under this configuration, the power and ground layer connections from IC 400a to embedded capacitor core 210 have about equal lengths. Similarly, the power and ground layer connections from IC 400b to embedded capacitor core 210 have about equal lengths. Such configuration may provide better uniformity in capacitor coupling, thereby providing better bounce or noise reduction effects and avoiding undesirable inductance in some cases. As an example, the embedded capacitor core itself may be a combination of a number of capacitors coupled in parallel, series, or in a combination of both. The embedded capacitor core may also be designed to have more than two external couplings to provide two or more sets of separate capacitors.

Figure 8:
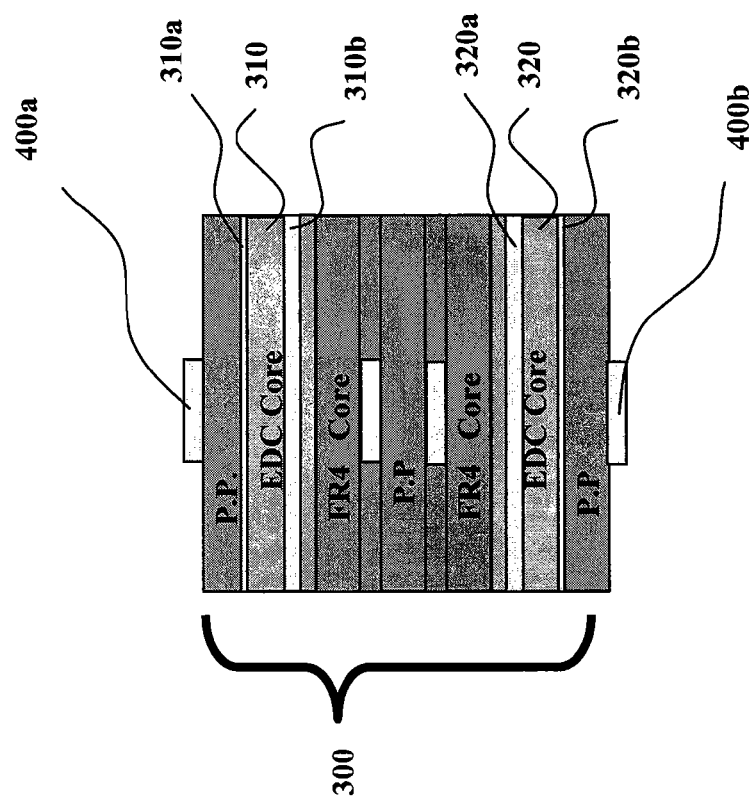
FIG. 8 illustrates a cross-sectional view of another example of providing embedded capacitor core couplings to ICs.

FIG. 8 illustrates another example of providing embedded capacitor core couplings to ICs 400a and 400b within PCB 300. In this example, two embedded capacitor cores 310 and 320 may both be embedded in PCB 300, one near the top of and another near the bottom of PCB 300. Power and ground wiring layers 310a and 310b may be placed close or adjacent to and separately coupled to the terminals of embedded capacitor core 310, and power and ground wiring layers 320a and 320b may be placed close or adjacent to and separately coupled to the terminals of embedded capacitor core 320. In one example, power and ground wiring layers 310a and 310b are coupled to IC 400a, and power and ground wiring layers 320a and 320b are coupled to IC 400b. This configuration may provide short wiring paths to the capacitors for the ICs and may reduce the inductance effect caused by long wiring paths from the ICs to capacitors. Similar to the configuration of FIG. 7, the configuration of FIG. 8 also provide a symmetric structure, which in some cases may reduce imbalances or interferences in system design or signals.

In addition to those four wiring layers, PCB 200 may contain additional wiring layers, such as the other two layers shown in FIG. 8 between wiring layers 310b and 320a. Under this configuration, the power and ground layer connections from IC 400a to embedded capacitor core 310 have about equal lengths. Similarly, the power and ground layer connections from IC 400b to embedded capacitor core 320 have about equal lengths. Additionally, the proximity of core 310 to IC 400a and core 320 to IC 400b also shortens the wiring path from the terminals to the embedded capacitor cores. In some examples, the terminals from ICs may be connected directly to capacitors embedded in the area of the PCB that is under the ICs. Such configuration and other configurations illustrated in FIG. 8 may provide better uniformity in capacitor coupling, thereby providing better noise reduction effects and avoiding undesirable inductance in some cases. As an example, each of embedded capacitor cores 310 and 320 itself may be a combination of a number of capacitors coupled in parallel, series, or in a combination of both. An embedded capacitor core may also be designed to have more than two external couplings to provide two or more sets of separate capacitors.

In light of the illustrations above, the configuration of a PCB may be designed in various ways to include one or more embedded capacitor cores and provide one or more capacitors serving one or more functions for circuit(s) or IC(s) coupled to the PCB. For example, the thickness, capacitance, number of capacitors, electrode design, and electrode patterns within an embedded capacitor core may be varied to accommodate the need of various applications. Similarly, the number of embedded capacitor cores, number of layers, number of wiring or interconnection layers, wiring patterns, couplings to capacitor(s), and thicknesses of different layers may also be varied to accommodate the need of various applications.

As illustrated above, examples consistent with the present invention may provide a capacitor device with low-profile or thin, planar conductors, which may be infixed into a dielectric film with an appropriate or high dielectric constant. In some examples, the low profile or thin, planar configuration of the conductors reduces the chances of possible shorting problems, which may occur when the dielectric film is thin or when the conductors do not have a smooth or planar surface. The capacitor device may have a very thin structure due to such design and can be easily embedded into a PCB without significantly changing the layered structure or thickness of the PCB. The embedded design also may provide the ease in arranging wiring paths and/or allow the ground and power wiring and capacitor device(s) to be arranged flexibly to meet various requirements, such as the exemplary specifications illustrated in Table 1.

As noted above, examples of embedded capacitor core, its configuration, its formation, and related applications are provided. Those skilled in the art would appreciate that they can make changes the embodiments described above without departing from the broad inventive concept described herein. Accordingly, this invention is not limited to the particular embodiments disclosed, but is intended to cover modifications within the spirit and scope of the present invention as defined by the appended claims.

We claim:

1. A printed circuit board comprising:
an embedded capacitor embedded in the printed circuit board, the embedded capacitor comprising:
- a first conductive pattern of a first conductive film transferred from a first sacrificial substrate;
- a second conductive pattern of a second conductive film transferred from a second sacrificial substrate; and
- a first dielectric film between the first conductive pattern and the second conductive pattern; the first conductive pattern and the second conductive pattern being infixed into the first dielectric film from opposite sides of the first dielectric film and portions of the first dielectric film being sandwiched between the first conductive pattern and the second conductive pattern;

a power wiring layer; and
a ground wiring layer,
wherein the power and ground wiring layers are embedded in the printed circuit board.

2. The printed circuit board of claim 1, wherein at least one of the first and second sacrificial substrates comprises a metal substrate provided for forming a conductive pattern thereon and burying the conductive pattern into the first dielectric film through a conductive film infix process.

3. The printed circuit board of claim 1, wherein at least one of the first and second conductive layers is buried into the first dielectric film through conductive film infix process.

4. The printed circuit board of claim 1, wherein at least one of the first and second conductive patterns comprises copper and at least one of the first and second conductive films has a thickness of no less than 5 micrometers.

5. The printed circuit board of claim 1, wherein the first dielectric film comprises an organic dielectric film having a dielectric constant of no less than 10.

6. A printed circuit board comprising:
an embedded capacitor core embedded in the printed circuit board, the embedded capacitor core comprising:
- a first set of capacitors comprising:
  - a first conductive pattern comprising at least two conductive electrodes;
  - a second conductive pattern comprising at least two conductive electrodes corresponding to the two conductive electrodes of the first conductive pattern; and
  - a first dielectric film between the first conductive pattern and the second conductive pattern, the first conductive pattern and the second conductive pattern being infixed into the first dielectric film, and portions of the first dielectric film being sandwiched between the first conductive pattern and the second conductive pattern;
- a second set of capacitors comprising:
  - a third conductive pattern comprising at least two conductive electrodes;
  - a fourth conductive pattern comprising at least two conductive electrodes corresponding to the two conductive electrodes of the third conductive pattern; and
  - a second dielectric film between the third conductive pattern and the fourth conductive pattern, the third conductive pattern and the fourth conductive pattern being infixed into the second dielectric film, and portions of the second dielectric film being sandwiched between the third conductive pattern and the fourth conductive pattern; and
- an inter-layer dielectric film between the first set of capacitors and the second set of capacitors,
wherein at least one of the conductive electrodes of the first or second conductive pattern is electrically coupled to at least one of the conductive electrodes of the third or fourth conductive pattern;

a power wiring layer; and
a ground wiring layer,
wherein the power and ground wiring layers are embedded in the printed circuit board.

7. The printed circuit board of claim 6, wherein the embedded capacitor core is incorporated within the printed circuit board to provide an embedded decoupling capacitor.

8. The printed circuit board of claim 6, wherein at least one of the first, second, third, and fourth conductive patterns comprises copper.

9. The printed circuit board of claim 6, wherein at least one of the first and second dielectric films has a dielectric constant of no less than 10.

10. The printed circuit board of claim 6, wherein at least one of the first and second dielectric films comprises an epoxy material containing $BaTO_3$.

11. The printed circuit board of claim 6, wherein the inter-layer dielectric film comprises a bonding layer having a dielectric constant of no less than 3.

12. The printed circuit board of claim 6, wherein the embedded capacitor core is incorporated into the printed circuit board at or near a center layer of the printed circuit board.

13. The printed circuit board of claim 12, wherein the power and ground wiring layers are placed adjacent to the embedded capacitor core.

14. The printed circuit board of claim 6, further comprising a second embedded capacitor core incorporated within the printed circuit board, the first embedded capacitor core being near the top portion of the printed circuit board and the second embedded capacitor being near the bottom portion of the printed circuit board.

15. A printed circuit board comprising:
at least one embedded capacitor core embedded in the printed circuit board, each embedded capacitor core including a plurality of layers of conductive patterns each having a plurality of conductive electrodes and being infixed into at least a dielectric layer, the plurality of layers of conductive patterns being stacked together to provide the at least one embedded capacitor core;
a power wiring layer; and
a ground wiring layer,
wherein the power and ground wiring layers are embedded in the printed circuit board.

* * * * *

UNITED STATES PATENT AND TRADEMARK OFFICE
CERTIFICATE OF CORRECTION

| | | |
|---|---|---|
| PATENT NO. | : 7,893,359 B2 | Page 1 of 1 |
| APPLICATION NO. | : 11/470435 | |
| DATED | : February 22, 2011 | |
| INVENTOR(S) | : Shih-Hsien Wu et al. | |

It is certified that error appears in the above-identified patent and that said Letters Patent is hereby corrected as shown below:

Claim 1, col. 11, line 10, after "second conductive pattern" delete ";" and insert a --,-- therefor.

Signed and Sealed this
Twenty-ninth Day of January, 2013

David J. Kappos
*Director of the United States Patent and Trademark Office*